US007522462B2

(12) United States Patent
Edahiro et al.

(10) Patent No.: US 7,522,462 B2
(45) Date of Patent: Apr. 21, 2009

(54) SENSE AMPLIFIER AND SEMICONDUCTOR MEMORY DEVICE WITH THE SAME

(75) Inventors: Toshiaki Edahiro, Yokohama (JP); Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/563,408

(22) Filed: Nov. 27, 2006

(65) Prior Publication Data

US 2007/0147112 A1 Jun. 28, 2007

(30) Foreign Application Priority Data

Dec. 26, 2005 (JP) ............................. 2005-371322

(51) Int. Cl.
*G11C 7/00* (2006.01)

(52) U.S. Cl. ........................ 365/205; 365/208; 365/196; 365/206

(58) Field of Classification Search ................. 365/208, 365/205, 196, 207; 327/55
See application file for complete search history.

(56) References Cited

U.S. PATENT DOCUMENTS

| 4,816,706 | A | * | 3/1989 | Dhong et al. ................. 327/57 |
| 5,477,495 | A | * | 12/1995 | Tanaka et al. ............... 365/203 |
| 5,668,765 | A | * | 9/1997 | Ang ............................ 365/205 |
| 5,699,305 | A | * | 12/1997 | Kawashima ................. 365/190 |
| 6,181,623 | B1 | * | 1/2001 | Shim et al. ................... 365/208 |
| 6,411,559 | B1 | * | 6/2002 | Yokozeki .................... 365/205 |
| 6,847,555 | B2 | | 1/2005 | Toda |
| 2007/0147112 | A1 | | 6/2007 | Edahiro et al. |

FOREIGN PATENT DOCUMENTS

JP     2005-285161     10/2005

OTHER PUBLICATIONS

U.S. Appl. No. 11/476,023, filed Jun. 28, 2006, Haruki Toda.
U.S. Appl. No. 11/832,987, filed Aug. 2, 2007, Toda.

* cited by examiner

*Primary Examiner*—Hoai V Ho
*Assistant Examiner*—Fernando N Hidalgo
(74) *Attorney, Agent, or Firm*—Oblon, Spivak, McClelland, Maier & Neustadt, P.C.

(57) ABSTRACT

A sense amplifier includes: NMOS transistors, drains thereof being coupled to output nodes, gates thereof being coupled to the output nodes, sources thereof being coupled in common to the ground potential node; PMOS transistors, drains thereof being coupled to the drains of the NMOS transistors, sources thereof being coupled to the input nodes; PMOS transistors, drains thereof being coupled to the input nodes, gates thereof being coupled to the output nodes, sources thereof being coupled to the power supply node via a current source device; and NMOS transistors disposed between the output nodes and the ground potential node to be turned on before sensing; and an equalizing transistor disposed between the output nodes.

13 Claims, 14 Drawing Sheets

In case of Ic > Ir

In case of Ic > Ir

SENSE AMPLIFIER AND SEMICONDUCTOR MEMORY DEVICE WITH THE SAME

CROSS-REFERENCE TO RELATED APPLICATION

This application is based on and claims the benefit of priority from the prior Japanese Patent Application No. 2005-371322, filed on Dec. 26, 2005, the entire contents of which are incorporated herein by reference.

BACKGROUND OF THE INVENTION

1. Field of the Invention

This invention relates to a sense amplifier for reading out cell data of a semiconductor memory device, and relates to a semiconductor memory device with the same.

2. Description of the Related Art

In the field of mobile devices utilizing a large density of data such as still or moving image, there is increased a demand for NAND-type flash memories in accordance with increasing the uses. Especially, it has already been achieved a multi-level storage scheme, which is able to store two bits per cell, the NAND-type flash memory is recently made possible to store a large quantity of data in a small chip area.

Recently, there has already been provided such a flash memory that two memory cells are selected simultaneously as a pair, and data thereof is sensed at a high rate with a current detecting type of sense amplifier (for example, refer to Unexamined Japanese Patent Application Publication No. 2004-319007).

To achieve the read performance of the above-described flash memory, it is necessary for preparing such a sense amplifier that is able to detect a small cell current at a high rate.

SUMMARY OF THE INVENTION

According to an aspect of the present invention, there is provided a sense amplifier including:

first and second input nodes, to one of which a cell current is provided, a reference current being provided to the other;

first and second output nodes, to which cell data are amplified and output, the cell data being defined by the difference between the cell current and the reference current;

first and second NMOS transistors, drains thereof being coupled to the first and second output nodes, respectively, gates thereof being coupled the second and first output nodes, respectively, sources thereof being coupled in common to a ground potential node;

first and second PMOS transistors, drains thereof being coupled to the drains of the first and second NMOS transistors, respectively, sources thereof being coupled to the second and first input nodes, respectively, the first and second PMOS transistor constituting a latch with the first and second NMOS transistors;

third and fourth PMOS transistors, drains thereof being coupled to the second and first input nodes, respectively, gates thereof being coupled to the second and first output nodes, respectively, sources thereof being coupled in common to a power supply node via a current source switching device;

third and fourth NMOS transistors disposed between the second and first output nodes and the ground potential node, respectively, and turned on before sensing; and an equalizing transistor disposed between the first and second output nodes to equalize the first and second output nodes in potential before sensing.

According to another aspect of the invention, there is provided a semiconductor memory device including a cell array with electrically rewritable and non-volatile memory cells arranged therein, multiple memory cells constituting a NAND string, and a current-detecting type of sense amplifier configured to sense data of a selected memory cell in the cell array, wherein the sense amplifier includes:

first and second input nodes, to one of which a cell current is provided, a reference current being provided to the other;

first and second output nodes, to which cell data are amplified and output, the cell data being defined by the difference between the cell current and the reference current;

first and second NMOS transistors, drains thereof being coupled to the first and second output nodes, respectively, gates thereof being coupled the second and first output nodes, respectively, sources thereof being coupled in common to a ground potential node;

first and second PMOS transistors, drains thereof being coupled to the drains of the first and second NMOS transistors, respectively, sources thereof being coupled to the second and first input nodes, respectively, the first and second PMOS transistor constituting a latch with the first and second NMOS transistors;

third and fourth PMOS transistors, drains thereof being coupled to the second and first input nodes, respectively, gates thereof being coupled to the second and first output nodes, respectively, sources thereof being coupled in common to a power supply node via a current source switching device;

third and fourth NMOS transistors disposed between the second and first output nodes and the ground potential node, respectively, and turned on before sensing; and an equalizing transistor disposed between the first and second output nodes to equalize the first and second output nodes in potential before sensing.

DETAILED DESCRIPTION OF THE EMBODIMENTS

Illustrative embodiments of this invention will be explained with reference to the accompanying drawings below.

Figure 1:
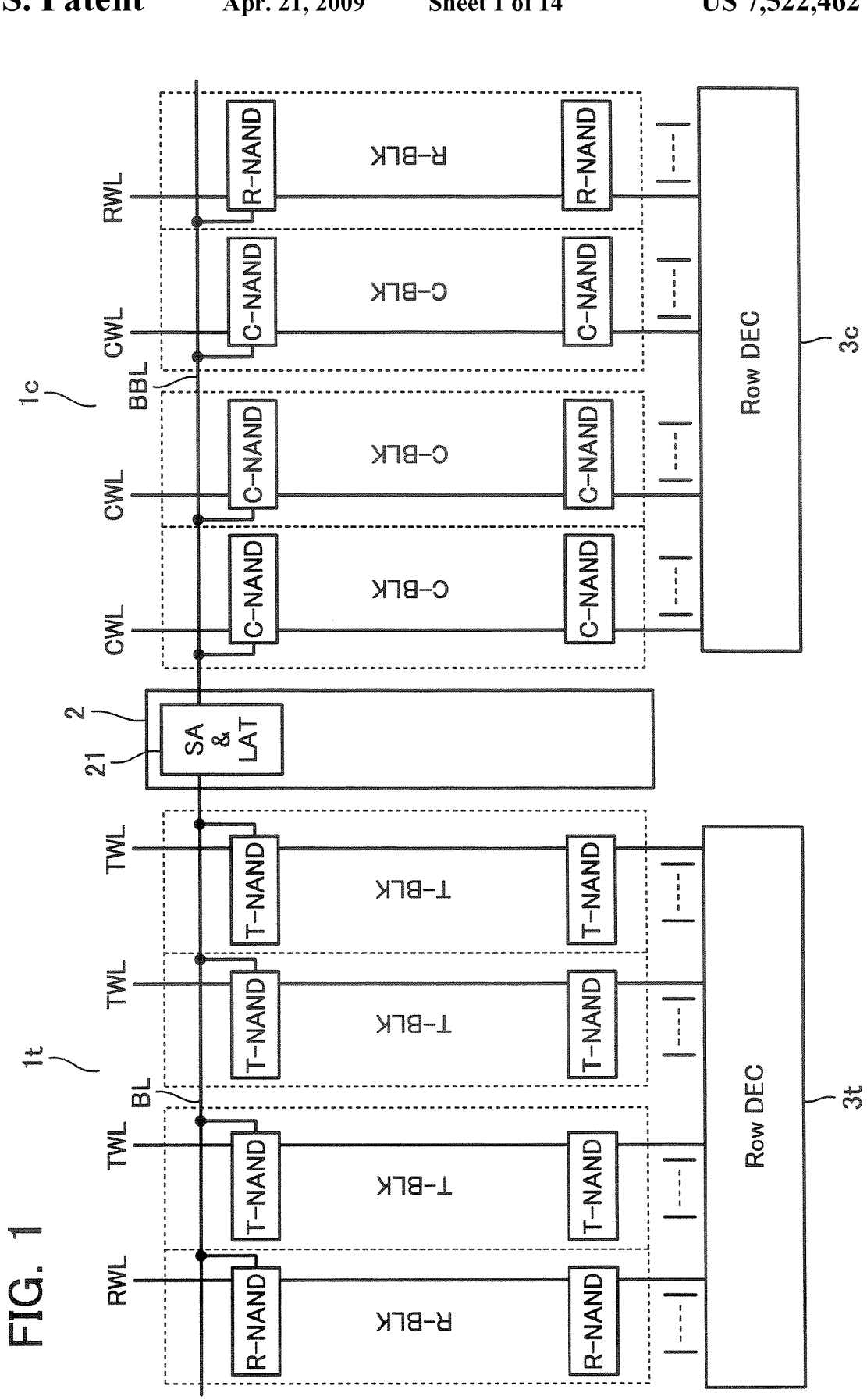
FIG. 1 shows a memory core configuration of a NAND-type flash memory in accordance with an embodiment of the present invention.

FIG. 1 shows a memory core circuit configuration of a NAND-type flash memory in accordance with an embodiment of the present invention. The memory core circuit includes: cell arrays $1t$ and $1c$; a sense amplifier 2, which the cell arrays $1t$ and $1c$ share; and a row decoder circuits $3t$ and $3c$ for selectively driving the word lines (TWL, CWL, RWL) of the cell arrays $1t$ and $1c$, respectively.

In this embodiment, to detect a cell current in comparison with a reference current, and read out cell data, a current-detecting type of differential amplifier is used in the sense amplifier circuit 2. For the purpose, a plurality of information cell (T-cell) blocks, T-BLK, and a reference cell (R-cell) block, R-BLK, are disposed in one of cell arrays $1t$ and $1c$; and a plurality of information cell (C-cell) blocks, C-BLK, and a reference cell (R-cell) block, R-BLK, in the other.

There are no differences in structure between the information cell blocks T-BLK, C-BLK and the reference cell block R-BLK. That is, each one is selected as the reference cell block in multiple cell blocks arranged in the respective cell arrays. As described later, in case of four-level storage scheme, one of four data levels is stored in each cell in the information cell blocks T-BLK and C-BLK; and a reference level in each cell in the reference cell block R-BLK.

Figure 2:
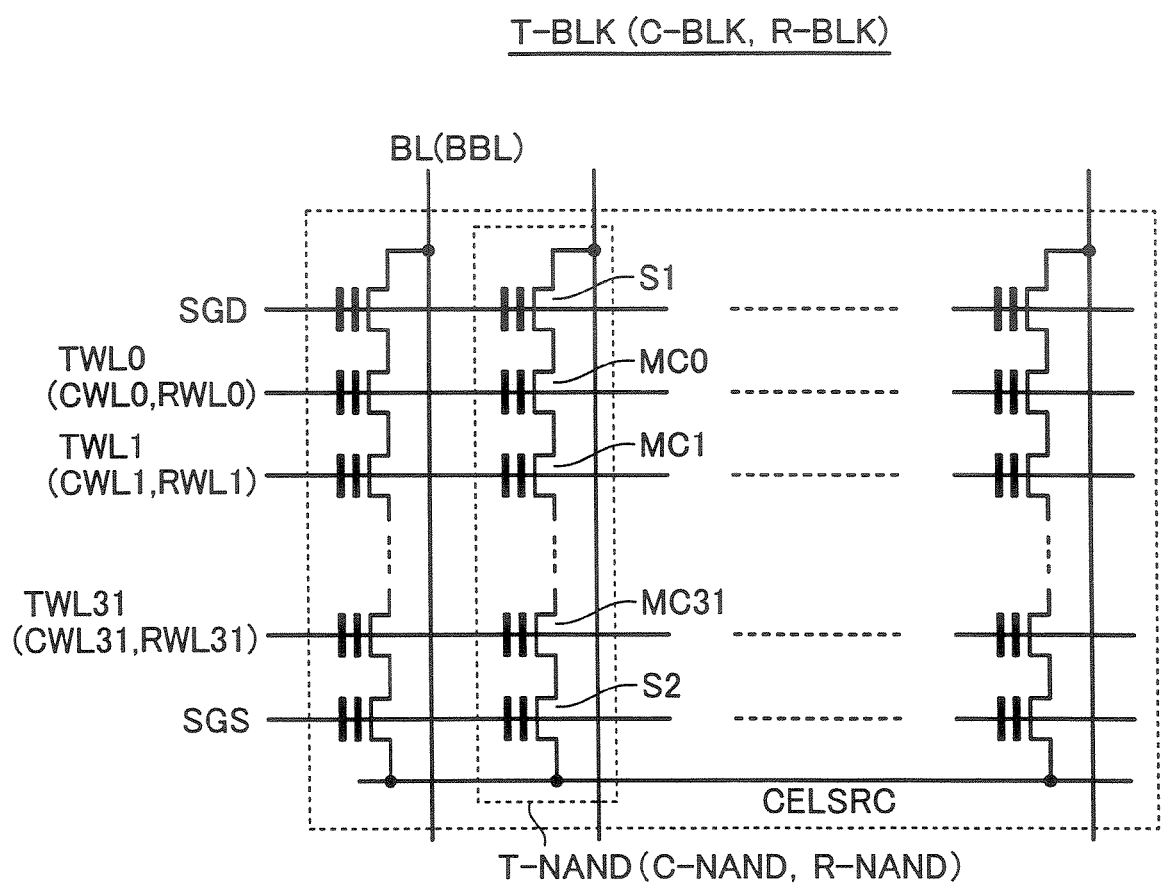
FIG. 2 shows the cell block configuration of the memory core.

As shown in FIG. 1, each of cell blocks T-BLK, C-BLK and R-BLK is formed of a plurality of NAND strings T-NAND, C-NAND and R-NAND arranged therein. Each NAND string has, as shown in FIG. 2, a plurality of electrically rewritable and non-volatile semiconductor memory cells MC0-MC31 connected in series and select gate transistors S1 and S2 disposed at both ends thereof.

Control gates of the memory cells MC0-MC31 are coupled to different word lines TWL0-TWL31 (or CWL0-CWL31, RWL0-RWL31), respectively, while gates of the select gate transistors S1 and S2 are coupled to select gate lines SGD and SGS, respectively.

Bit lines BL and BBL of the cell array constitute a pair, and are coupled to the sense amplifier circuit 2. When one information cell block T-BLK (or C-BLK) is selected from one cell array $1t$ (or $1c$), reference cell block R-BLK is selected from the other cell array $1c$ (or $1t$), and cell current of a selected information cell T-cell (or C-cell) and reference cell current of a selected reference cell R-cell are input to the sense amplifier circuit 2 via the bit lines BL and BBL.

Figure 3:
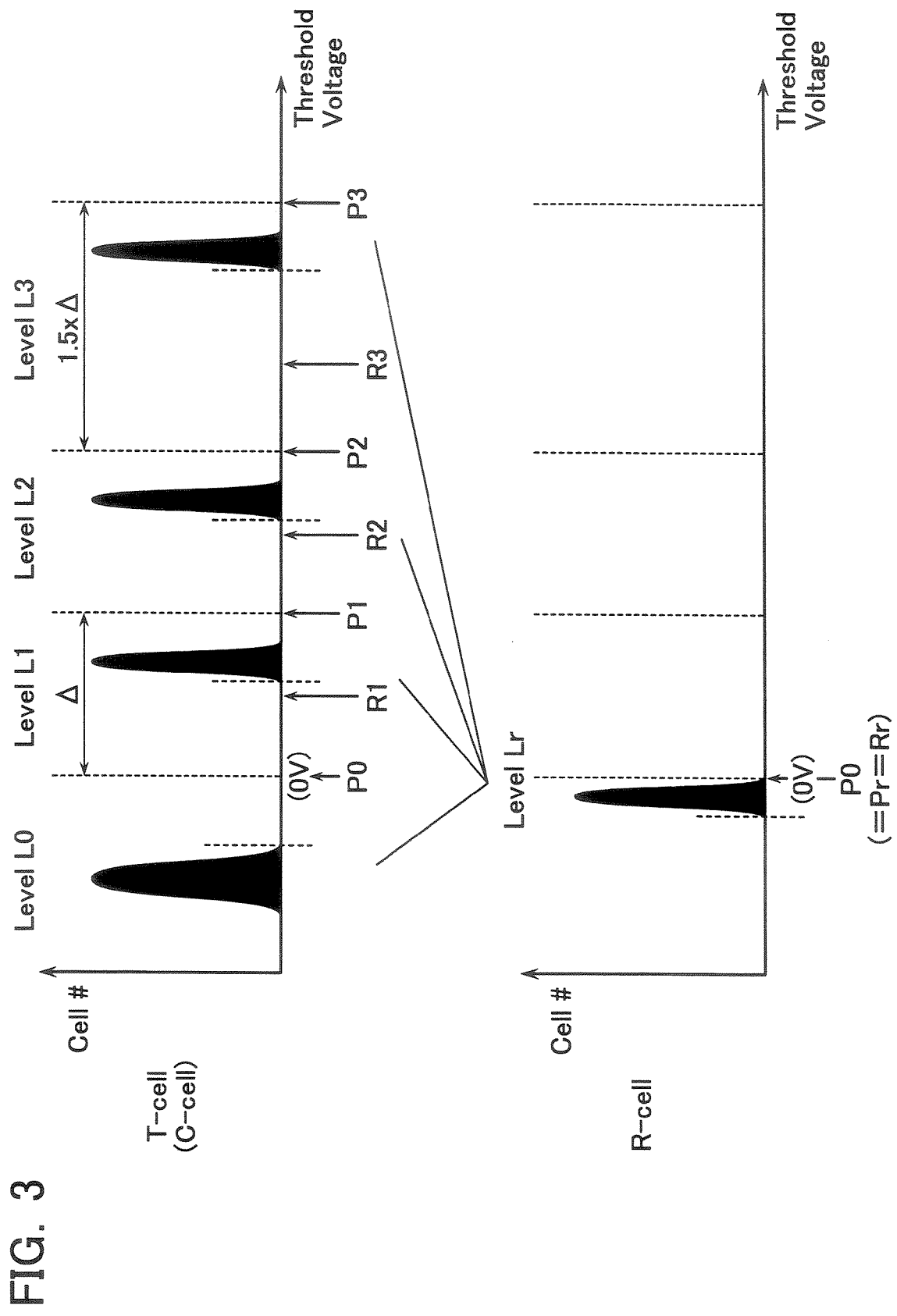
FIG. 3 shows data levels in case the flash memory stores four-level data.

FIG. 3 shows the relationships between data levels of the information cell T-cell (or C-cell) and the reference cell R-cell in case of storing four-level data. In the information cell T-cell (or C-cell), one of four data levels L0-L3 is written as being defined by the cell threshold voltage, while in the reference cell R-cell, a reference level Lr is written as also being defined by the cell threshold voltage.

The lowest data level L0 is a negative threshold voltage state, which is defined as an erase state with verify voltage P0. Data levels L1, L2 and L3 are positive threshold voltage states, which are defined as write states with verify voltages P1, P2 and P3, respectively. The reference level Lr is a state, where the cell threshold voltage is about zero, defined with verify voltage Pr (=0V).

Data erase is performed for each block in such a way that all word lines in a selected block are set at 0V; and p-type well, on which the cell array is formed, is set at erase voltage Vera. As a result, electrons in the memory cell's floating gates will be discharged. Data erase of the information cell blocks T-BLK, C-BLK are the same as that of the reference cell block R-BLK.

Data write is performed as an electron-injection operation into cell's floating gate in accordance with write data with write voltage Vpgm applied to a selected word line in a selected block. Data write of the information cell blocks T-BLK, C-BLK is the same as that of the reference cell block R-BLK. In accordance with the verify voltages P1-P3 and reference verify voltage Pr used at the respective write-verify times, data levels L1-L3 and reference level Lr will be obtained as shown in FIG. 3.

Since the sense amplifier circuit 2 detects a difference between the information cell's current and the reference cell's current, a data level of the information cell T-cell in the cell array it and the corresponding data level of the information cell C-cell in the cell array $1c$ are sensed as reversed data. Therefore, the bit assignment of four-level data L0-L3 in the information cell T-cell is different from that in the information cell C-cell.

The detail is as follows. Supposing that four-level data is defined as (HB, LB) where HB and LB are the upper bit and the lower bit, respectively, for example, the four-level data are defines as: L0=(1,0), L1=(1,1), L2=(0,1) and L3=(0,0) in the information cell T-cell on the cell array $1t$ side. By contrast, L0=(0,0), L1=(0,1), L2=(1,1) and L3=(1,0) are defined in the information cell C-cell on the cell array $1c$ side.

To distinguish between data levels L0-L3 with reference to the reference level Lr at a read time, the read voltage applied to a selected word line is set at R1, R2 and R3 in accordance with three read steps, while that applied to the reference cell R-cell, Rr, is kept at about the reference data level Lr in the reference cell C-cell through the three read steps. At a write-verify time, verify voltages P1, P2 and P3 are used for the information cell, while verify voltage Pr(=Rr) is used for the reference cell.

Figure 4:
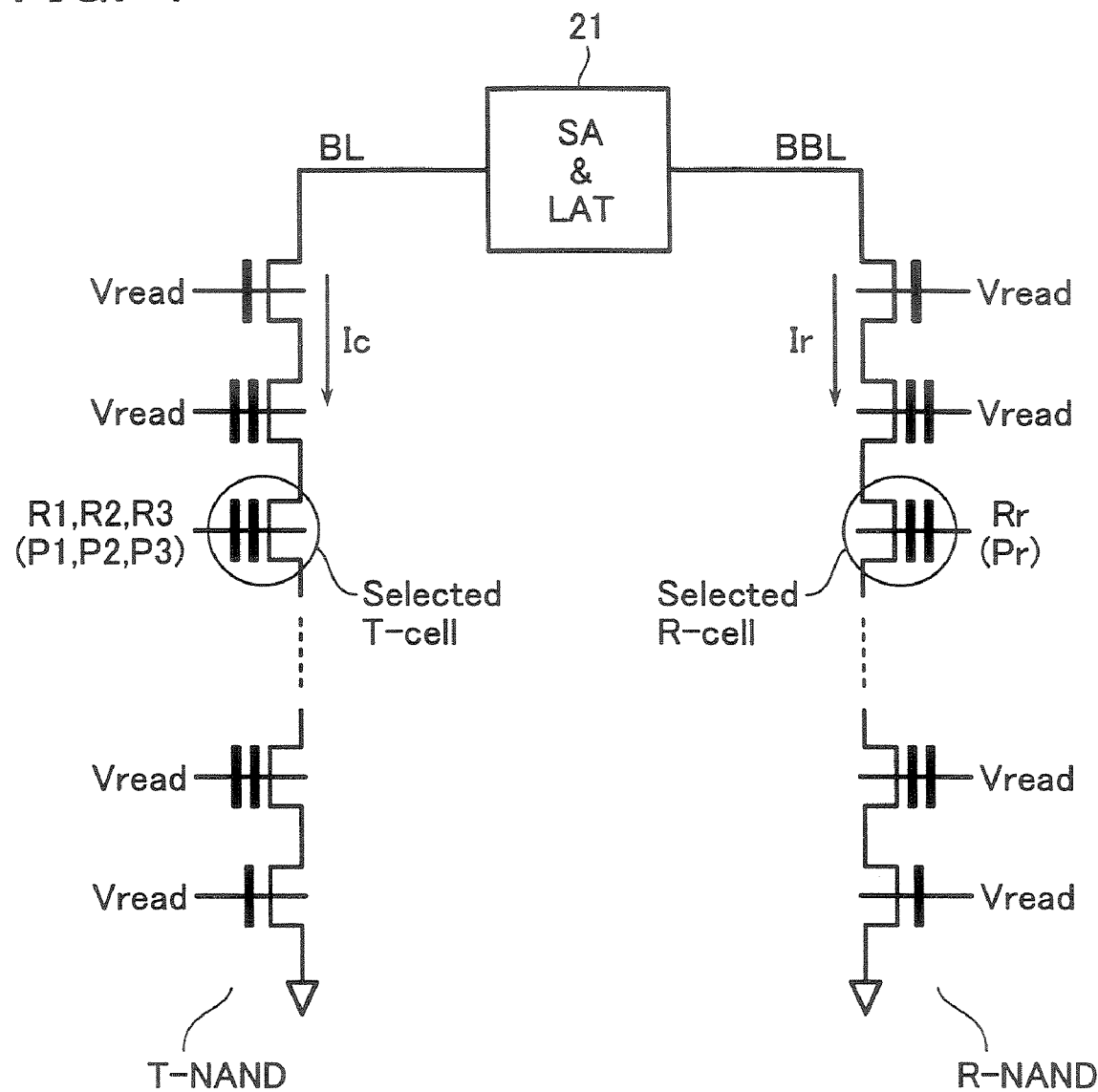
FIG. 4 is a diagram for explaining the principle of data read of the flash memory.

FIG. 4 shows the bias relationships in NAND strings at a normal read time and write-verify read time. As shown in FIG. 4, when one information cell T-cell is selected in an information cell NAND string T-NAND on the bit line BL side, one reference cell R-cell is selected in the reference cell NAND string R-NAND of the bit line BBL side. Selected word lines coupled to the selected information cell and the selected reference cell are set at read voltage R1 (or R2, R3) and Rr. The remaining non-selected word lines and select gate lines are applied with read pass voltage Vread, which is set to turn on cells without regard to cell data.

At the write-verify time, the information cell T-cell is applied with one of verify voltages P1-P3 in place of the read voltages R1-R3 while the reference cell R-cell is applied with the verify voltage Pr.

Under the above-described bias condition, the sense unit 21 detects the difference between cell current Ic flowing in the information cell NAND string and the reference current Ir flowing in the reference cell NAND string, and senses cell data.

Figure 5:
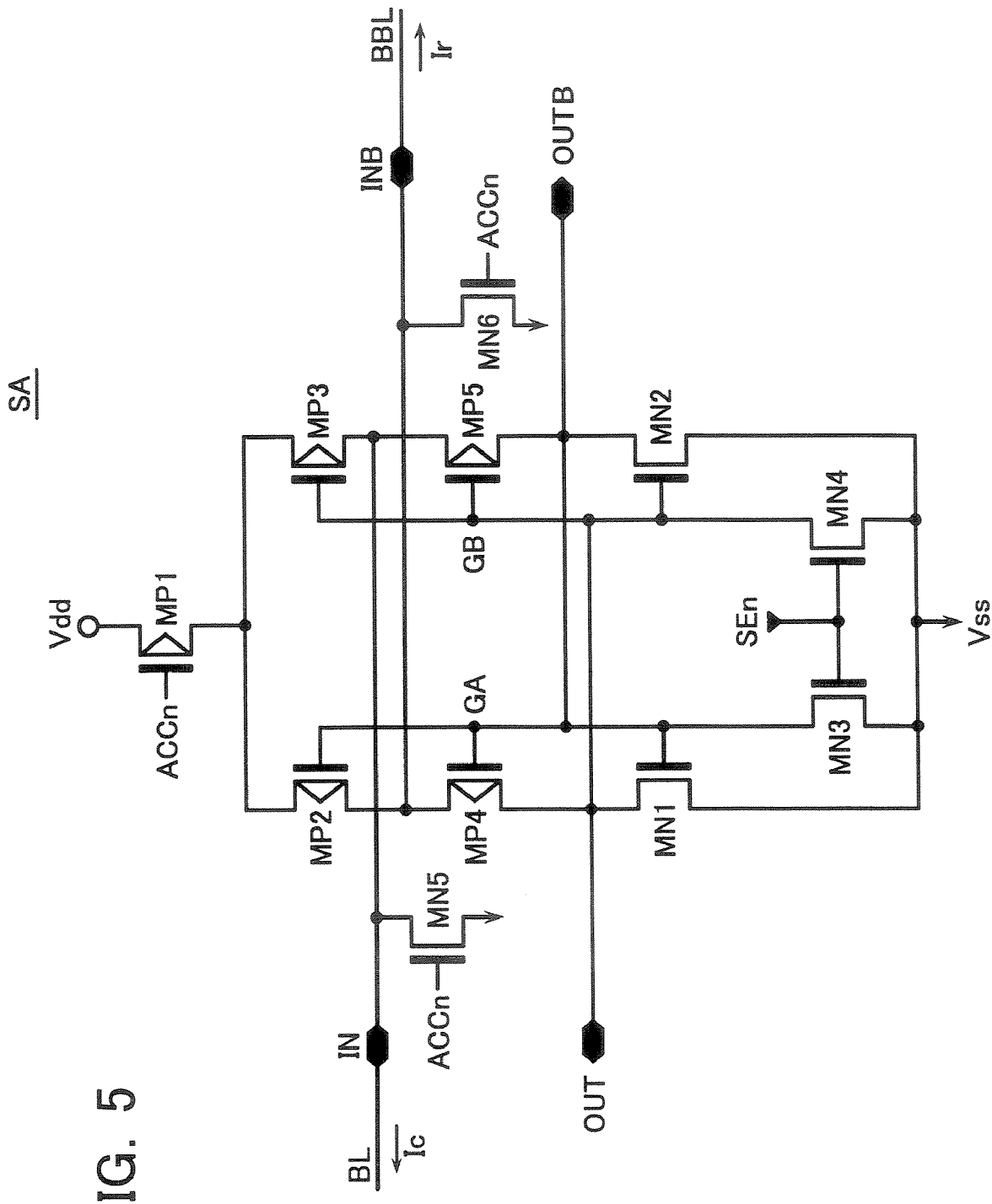
FIG. 5 shows a basic configuration of the sense amplifier in the memory core.

FIG. 5 shows a basic sense amplifier SA in the sense unit 21. While the sense unit 21 includes sense amplifiers SA and a data latch LAT, only the sense amplifier SA will be explained below.

The sense amplifier SA shown in FIG. 5 is latch-type one, which is formed for the purpose of sensing cell current of about 1 µA at a high rate. This sense amplifier SA has a pair of PMOS transistor MP4 and NMOS transistor MN1, the common drain and common gate GA of which are coupled to a first output node OUT and a second output node OUTB, respectively, and another pair of PMOS transistor MP5 and NMOS transistor MN2, the common drain and common gate GB of which are coupled to the second output node OUTB and the first output node OUT, respectively. These transistor pairs constitute a latch.

The sources of NMOS transistors MN1 and MN2 are coupled in common to the ground potential node Vss. Disposed between the gate nodes GA, GB and the ground potential node Vss are NMOS transistors MN3 and MN4, which are on in a stationary state, and turns off in response to sense signal SEn="L". These NMOS transistors MN3 and MN4 serve for amplifying cell current at the beginning of data sense with SEn="H".

The sources of PMOS transistors MP4 and MP5 serve as input nodes INB and IN, respectively. Disposed between these input nodes INB, IN and power supply node Vdd is an activation PMOS transistor (i.e., current source switching transistor) MP1. Further disposed between the input nodes INB, IN and activation PMOS transistor MP1 are PMOS transistors MP2 and MP3, respectively, the gates of which are coupled to the common gates GA and GB, respectively.

Disposed at the input nodes IN and INB, to which bit lines BL and BBL are to be coupled, respectively, are reset-use NMOS transistors MN5 and MN6, which are driven with activation signal ACCn.

Figure 6:
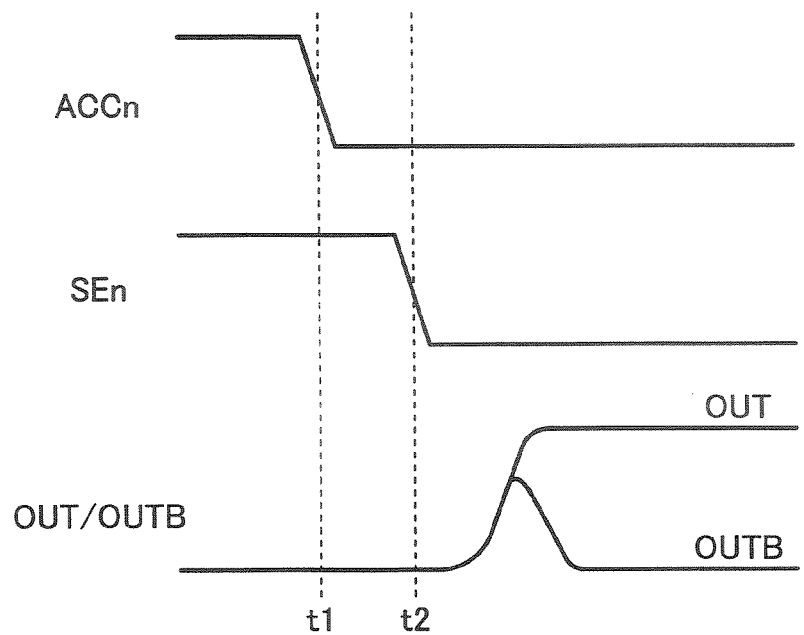
FIG. 6 shows waveforms of the sense amplifier.

FIG. 6 shows operation waveforms of the sense amplifier SA. While the sense amplifier SA is inactive with ACCn=SEn="High", PMOS transistor MP1 is off; and NMOS transistors MN3, MN4, MN5 and MN6 are on. Therefore, all of the input nodes IN, INB and output nodes OUT, OUTB is set at a low level (=Vss).

When ACCn becomes "Low" at timing t1, activation PMOS transistor MP1 is turned on; and reset NMOS transistors MN5 and MN6 are turned off, so that the power supply current is supplied to the sense amplifier SA. At the same time, current of the information cell (i.e., cell current), Ic, and that of the reference cell (i.e., reference current), Ir, flow on the bit lines BL and BBL, and this causes a small current difference between one current passage of PMOS transistor MP5-NMOS transistor MN3 and the other current passage of PMOS transistor MP4-NMOS transistor MN4 in accordance with the cell current difference, resulting in that a small voltage difference is generated between the output nodes OUT and OUTB. This is the amplifying operation at the beginning of sensing.

Then, sense signal SEn being set at "Low" at timing t2, NMOS transistors MN3 and MN4 are turned off, so that the voltage difference between the output nodes OUT and OUTB is amplified based on the positive feed-back of the latch, finally resulting in that one is set at "High" (=Vdd); and the other at "Low". For example, in case of Ic>Ir, as shown in FIG. 6, OUT="H", and OUTB="L" will be obtained.

Since this sense amplifier SA is current-sensing type one, the capacitances of the bit lines BL and BBL coupled to the input nodes IN and INB do not affect the sense speed. Therefore, even if the NAND-type flash memory has a few pF bit line capacitance, and cell current is small such as about a few hundred nA, it becomes possible to perform a sufficiently high-speed data sense.

In the currently used NAND flash memories, data read is performed in such a way as to detect whether the precharged bit line is discharged of not in accordance with ON/OFF of a selected memory cell. Therefore, there are no reference cells. By contrast, while it is required of the current-detecting type of sense amplifier to use a reference cell, the reference cell being disposed in the cell array with the same structure as that of the regular memory cell as shown in FIGS. 1 to 4, there are no overheads with respect to the chip area.

However, in case the cell current is about 200 nA, and the reference current is 100 nA, the current difference becomes no more than about 100 nA. When considering variations of threshold voltages and gate lengths of transistor pairs in the sense amplifier SA, if the current difference based on the above-described variations of transistor pairs becomes 100 nA or more, it will become impossible to perform data sense because the current difference based on the device variations is over the cell current difference.

For example, suppose that the supply current of the sense amplifier SA is 10 µA, and there is 0.02 µm variation of the gate lengths between NMOS transistors MN3 and MN4. In this case, gate length x[µm], which is necessary for suppressing the current difference based of the transistor variation to be 50 nA or less, must be set at about x=4 µm as being obtained from: $10[\mu A] \times 0.02[\mu m]/x[/\mu m]=50[nA]$.

If gate lengths of all transistors are increased to the large level as described above, not only the layout area is increased, but also the transistor's conductance is reduced, so that the sense speed becomes slow. Therefore, to achieve a high-speed sense performance with a small cell current, it is in need of suppressing the variations between transistors to be sufficiently low, and selecting such a transistor size as to obtain a large transistor conductance.

Therefore, in the embodiment described below, the basic sense amplifier SA shown in FIG. 5 will be improved to have a sufficient margin for the variations between transistors and to be able to do such a high-speed sense performance that the current difference of about scores nA is detected within a few ns.

Figure 7:
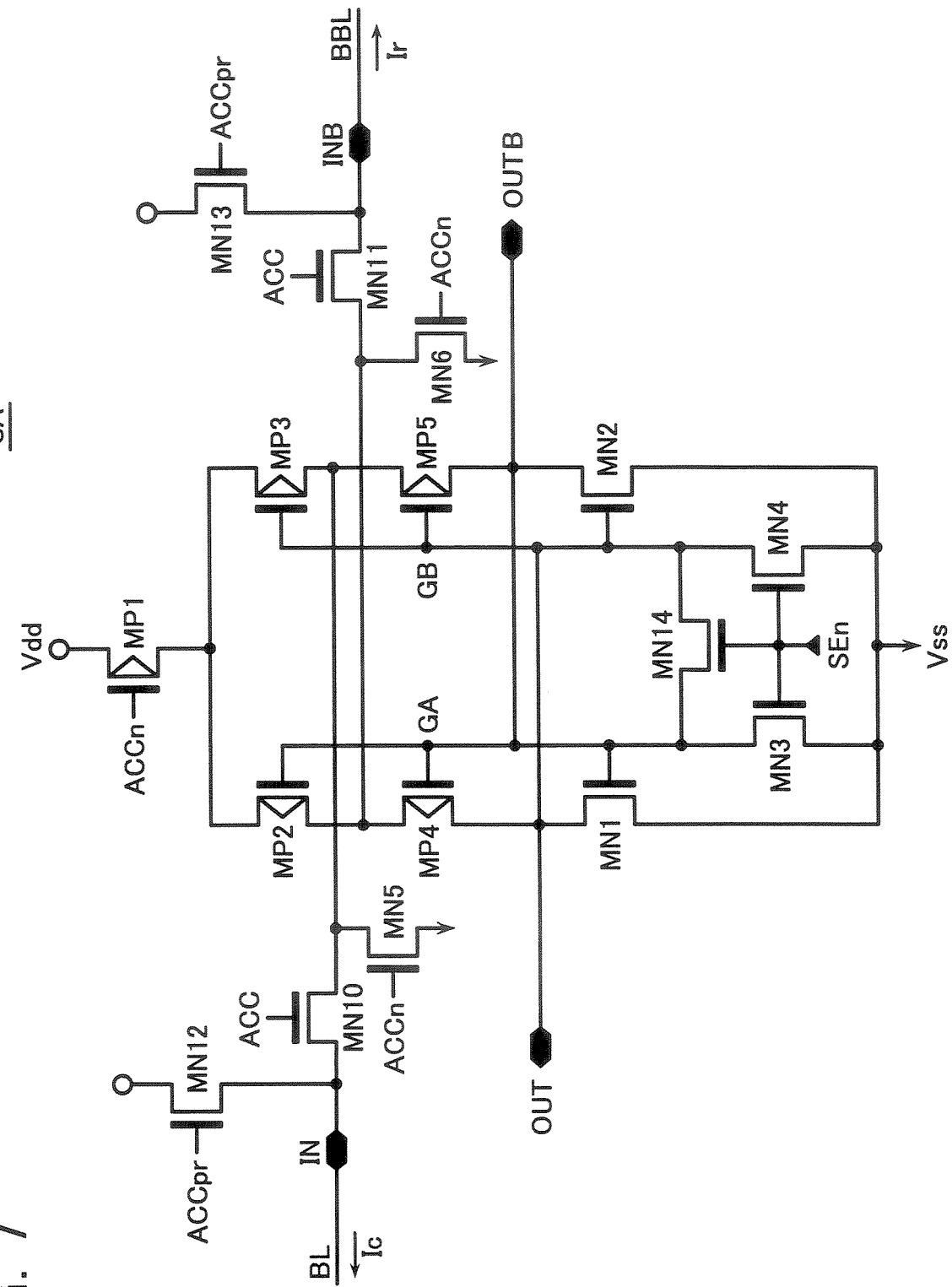
FIG. 7 shows a sense amplifier in accordance with an embodiment.

The sense amplifier SA shown in FIG. 7 is improved one, which is different from that shown in FIG. 5 as follows.

Firstly, bit line precharge NMOS transistors MN12 and MN13 are coupled to the input nodes IN and INB, respectively, for precharging the bit lines BL and BBL prior to the activation of the sense amplifier SA independently of the current source transistor MP1 of the sense amplifier. The gates of these NMOS transistors MN12 and MN13 are driven with precharge control signal ACCpr, which is set at "H" for a certain period prior to the activation signal ACCn="L".

To separate the bit lines BL, BBL from the sense amplifier body while the bit line precharge is performed with the NMOS transistors MN12 and MN13, separating NMOS transistors MN10 and MN11 are disposed at the input nodes IN and INB, respectively, which are driven with signal ACC that is complementary to the activation signal ACCn.

Secondary, equalizing NMOS transistor MN14 is disposed between the common gate nodes GA and GB of the latch, i.e., between the output nodes OUT and OUTB. The gate of transistor MN14 is driven with sense signal SEn together with NMOS transistors MN3 and MN4. In the initial sense period from the sense amplifier activation with ACCn="L" to the sense start with transistors MN1, MN2, MP4 and MP5 in response to sense signal SEn="H", NMOS transistor MN14 is kept on to short-circuit the output nodes OUT and OUTB.

Figure 8:
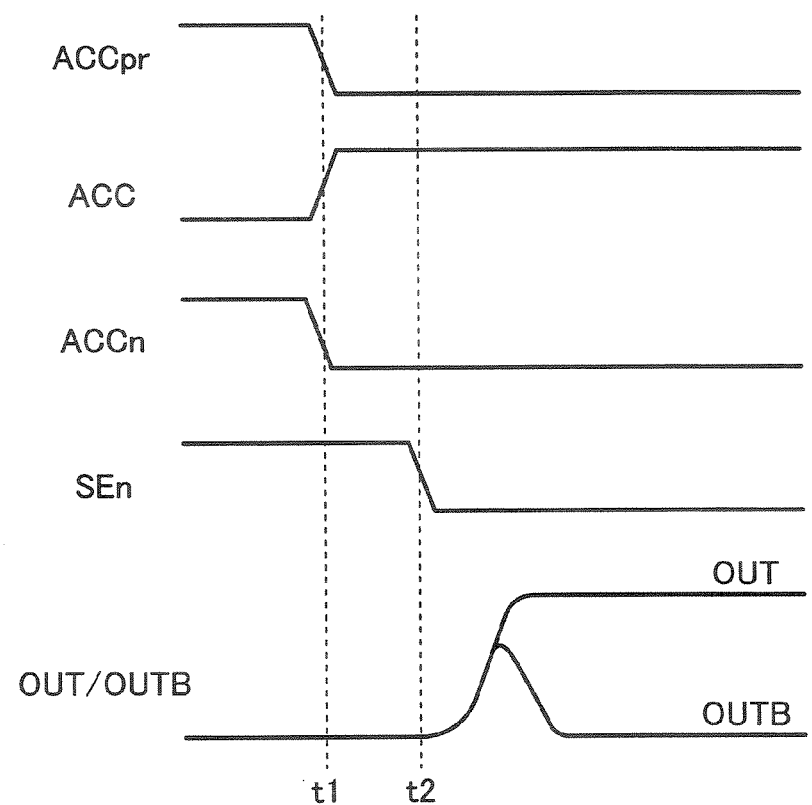
FIG. 8 shows waveforms of the sense amplifier.

FIG. 8 shows the operation waveforms of the sense amplifier SA in accordance with this embodiment. The activation signal ACCn being set at "L" (timing t1), power supply starts. A little late, the sense signal SEn being set at "L" (timing t2), data is sensed. This basic operation is the same as the sense amplifier shown in FIG. 5.

In this embodiment, prior to ACCn="L", bit lines BL and BBL are precharged for a certain period in accordance with ACCpr="H". During the bit line precharge, separating NMOS transistors MN10 and MN11 are kept off with ACC="L", so that the bit lines BL and BBL are separated from the sense amplifier. To activate the sense amplifier, bit line precharge NMOS transistors MN12 and MN13 are turned off, and NMOS transistors MN10 and MN11 are turned on. As a result, the bit lines BL and BBL are coupled to the sense amplifier.

To cause the memory cell to drain current, it is required of the memory cell to be boosted in drain voltage to a certain level (e.g., 0.5V or higher in case of NAND string). However, in case the bit line resistance and parasitic capacitance are large, it takes a certain time to boost the drain voltage. As shown in FIG. 7, as a result of that the bit lines and sense amplifier are separated from each other during the bit line precharge prior to the sense amplifier activation, waste current for the sense amplifier is cut off, and the consumption current will be reduced.

Further, in such a large capacitance memory that has very long bit lines, bit line resistance and parasitic capacitance become large. In this case, even if current-detecting type sense amplifier is used, it takes a long time to make the cell current of a memory cell disposed the farthest from the sense amplifier reach the input node of the sense amplifier. Therefore, even if the sense time is short, it is in need of waiting a sufficiently long time until sense starting.

By contrast, according to this embodiment, in which NMOS transistors MN10 and MN11 are disposed between the sense amplifier and the bit lines BL, BBL, the cell current may be amplified based on the clamping operation of the NMOS transistor MN10 or MN11, and input to the sense amplifier.

Further, supposing that there are no variations in transistors arranged in the sense amplifier, from the timing that ACCn becomes "L" to the timing that SEn becomes "L", the current difference between NMOS transistors MN3 and MN4 is equal to that between PMOS transistors MP5 and MP4 (i.e., equal to the difference between cell current Ic and reference current Ir). On the assumption of Ic−Ir=ΔIc, in case the current difference generated between the initially amplifying NMOS transistors MN3 and MN4 based on the variation thereof is ΔIc or more, the variation is amplified and sensed as it is, so that it becomes impossible to sense ΔIc.

In this embodiment, equalizing NMOS transistor MN14 disposed between the output nodes OUT and OUTB interconnects the output nodes OUT and OUTB to equalize them in potential during SEn="H". As a result, without increasing the gate length of NMOS transistors MN3 and MN4, the influence of variation thereof may be suppressed to a minimum level, and it becomes possible to sense the current difference ΔIc.

The detail will be explained below. Suppose that currents Im3, Im4 and Im14 flow in NMOS transistors MN3, MN4 and MN14, respectively. In case transistor MN14 is not disposed, Im3−Im4=ΔIc becomes signal quantity. By contrast, in case transistor MN14 is disposed, the current difference is expressed as Im3−Im4−2Im14=ΔIc. That is, it becomes equal to that the current difference is reduced by 2Im14. Therefore, the signal quantity is reduced, and the sense speed becomes slow a little, but the influence of variation will be reduced.

Next, taking note of PMOS transistors MP4 and MP5 in FIG. 7, the variation of PMOS transistors MP4 and MP5 is compensated during SEn="H" because NMOS transistor MN14 is disposed between them. However, when SEn becomes "L", the variation of PMOS transistors MP4 and MP5 is transferred to the output nodes OUT and OUTB, and it will be further amplified by the positive feed-back operation of the latch.

Figure 9:
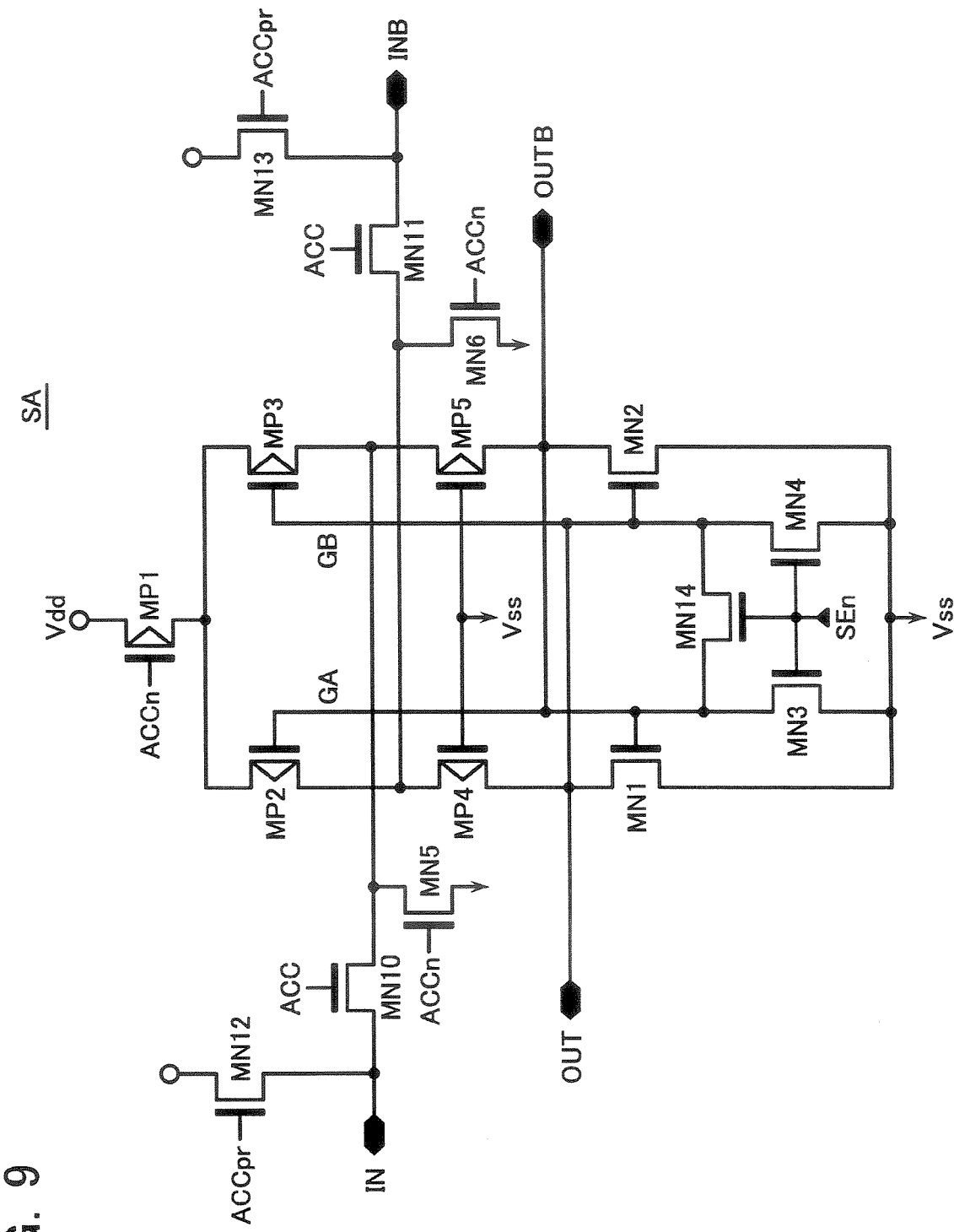
FIG. 9 shows a sense amplifier in accordance with another embodiment.

FIG. 9 shows another sense amplifier SA, in which the above-described problem is solved. Different from that shown in FIG. 7, gates of PMOS transistors constituting a latch are not coupled to the output nodes OUT and OUTB, but coupled in common to the ground potential node Vss. Otherwise, it is not different from that shown in FIG. 7.

A first advantage of this sense amplifier is in that the positive feed-back of PMOS transistors MP4 and MP5 is lost because gates thereof are coupled in common. Therefore, PMOS transistors MP4 and MP5 will not amplify their variations.

Secondary, transistors MP4 and MP5 are in a high conductance state as a stationary state because gates thereof are set at Vss. Therefore, as soon as SEn becomes "L", the output nodes OUT and OUTB may be boosted to NMOS transistor's threshold voltage level. As described above, the output nodes OUT and OUTB being rapidly boosted to the threshold level, it becomes possible to rapidly latch the signal amplified during the initial amplifying period in accordance with the positive feed-back operation of NMOS transistors MN1 and MN2.

Next, taking note of PMOS transistors MP2 and MP3 in FIG. 7, these currents are divided into first components flowing in the bit lines BL and BBL and second components flowing in PMOS transistors MP4 and MP5. Therefore, in case there is such a current variation that is equal to ΔIc or more between PMOS transistors MP2 and MP3, it will cancel the input current difference ΔIc to be sensed, thereby making impossible to sense.

If the gate length of the transistors MP2 and MP3 is made larger for reducing the variation of them, the current flowing in the sense amplifier is made less, and this leads to the reduction of sense speed.

Figure 10:
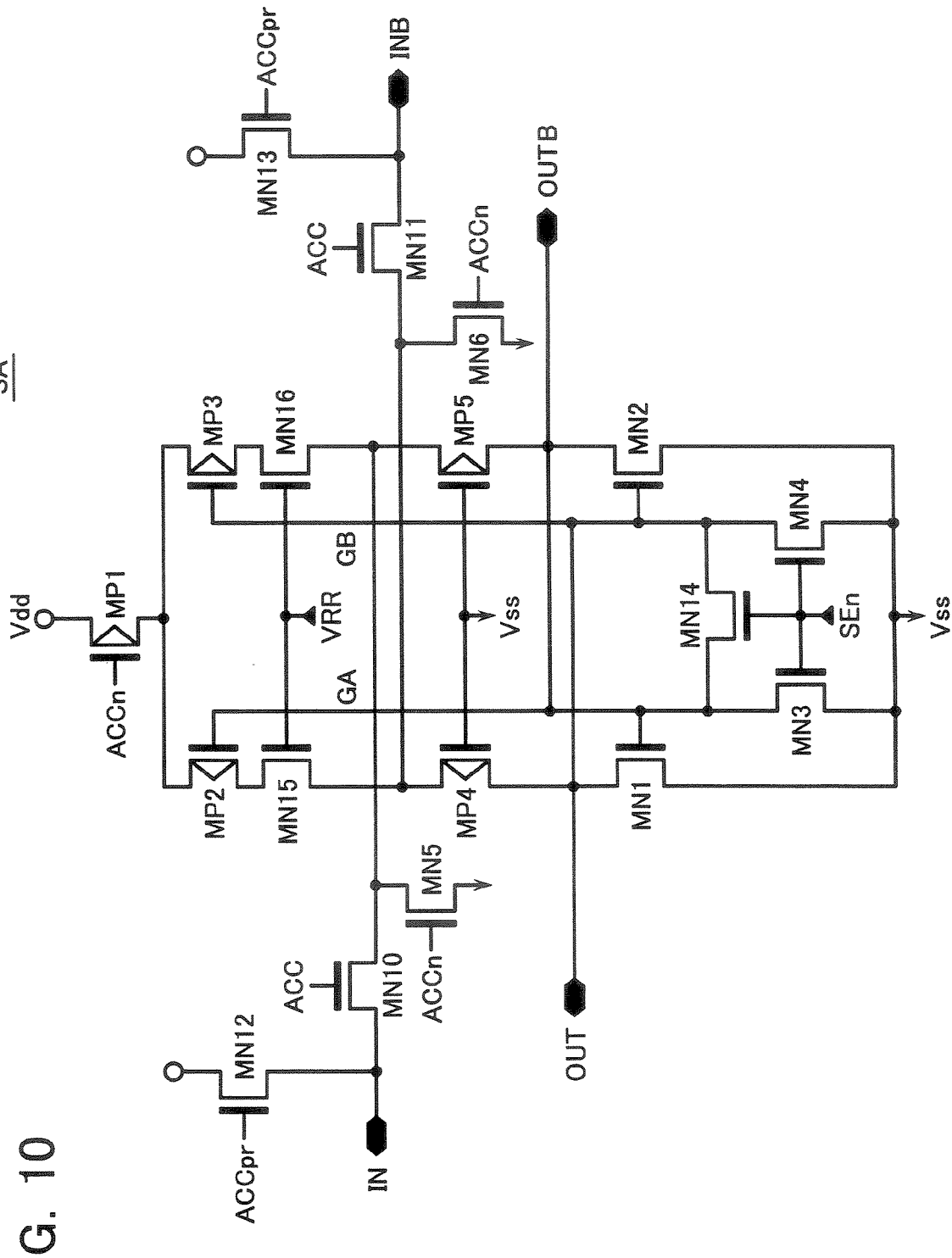
FIG. 10 shows a sense amplifier in accordance with still another embodiment.

FIG. 10 shows a sense amplifier SA in accordance with another embodiment, which solves the above-described problem. This sense amplifier SA is formed based on that shown in FIG. 9. In addition to the sense amplifier shown in FIG. 9, current-limiting NMOS transistors MN15 and MN16 are disposed between PMOS transistors MP2 and MP4, and between PMOS transistors MP3 and MP5, respectively. The common gate of these transistors MN15 and MN16 is driven by a control signal VRR.

Figure 11:
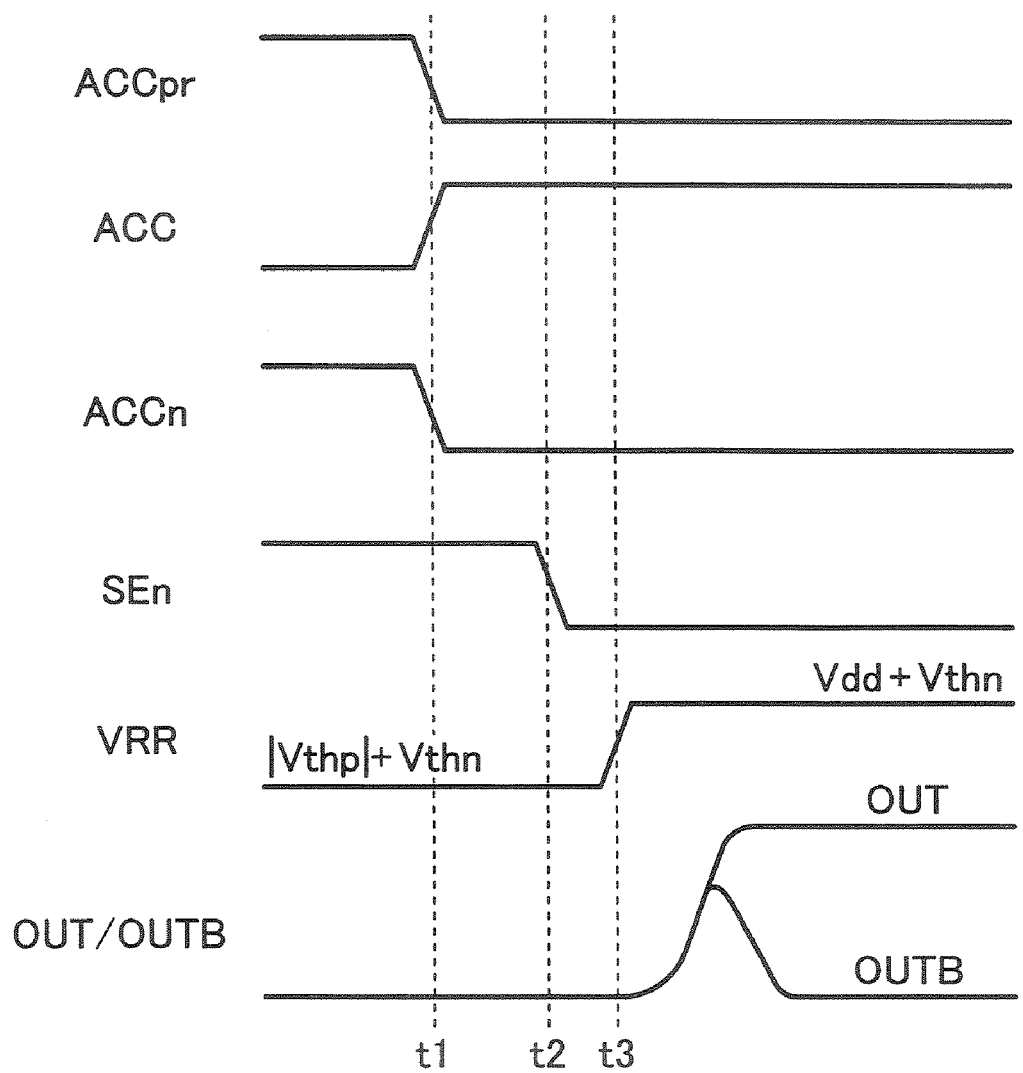
FIG. 11 shows waveforms of the sense amplifier.

These current-limiting NMOS transistors MN15 and MN16 are controlled in such a way as to squeeze the sense amplifier current at the beginning of sensing, and carry a significant current at the late sensing time. The detail will be explained below. At the early sensing time, i.e., within such a period while ACCn="L" and SEn="H", i.e., from t1 to t2 in FIG. 11, the control signal VRR is set at such a low voltage level that the currents of NMOS transistors MN15 and MN16 are squeezed, and difference thereof is made not more than ΔIc.

For example, the control signal VRR is set with taking note of the threshold voltage drop of NMOS transistor at such a level that a voltage higher than the threshold voltage of PMOS transistors MP4 and MP5 is passed, and it causes PMOS transistors MP4 and MP5 to carry currents. In detail, supposing that the threshold voltages of NMOS transistors and PMOS transistors are Vthn and Vthp, respectively, the signal VRR is set at VRR=Vthn+|Vthp| at the initial sensing time. As a result, without carrying waste current in the sense amplifier, it will be set in a state that the cell current difference ΔIc may be amplified.

Next, in a latching period of SEn="L", it is in need of supplying a sufficient current to the sense amplifier SA, and making the latch amplify the signal. Therefore, the control signal VRR is set at Vdd+Vthn or higher at timing t3 shown in FIG. 11 so that voltages may be transferred to the sources of NMOS transistors MN15 and MN16 without threshold voltage drop.

The advantage of that the control signal VRR is exchanged between the beginning of sensing (SEn="H") and the latching period (SEn="L") will be confirmed based on the AC analysis as follows.

Suppose that the voltage gain is: G=Vout/Voutb; the loop gain is: LG=(Vout)$^2$/(Voutb)$^2$; and the relationship between cell current Ic and reference current Ir is: Ic>Ir. In a state that the control signal VRR is low, the voltage gain is G<1. This means that the cell current Ic will be output to the output node OUTB via PMOS transistor MP5 as a voltage signal amplified based on the change of SEn.

If positive feed-back is not caused in the latch as a result of Ic>Ir, the change of OUTB becomes larger than that of OUT, so that G<1 is obtained. The fact that positive feed-back is not caused in the latch during the control signal VRR is low, suppresses such a situation that the variation of the sense amplifier SA is amplified at it is via the latch, and makes possible to amplify only the information of ΔIc. Therefore, even if the current is very small, the beginning of sensing has a sufficient margin for variations.

The control signal VRR being set at high, the threshold voltage drop of NMOS transistors MN15 and MN16 is lost, thereby making transistors MP4, MP5, MN1 and MN2 constitute a latch. Based on the positive feed-back amplifying in this latch, the amplitude of OUT becomes large, and LG>1 may be obtained. That is, the amplified signal in accordance with the cell current at the beginning is further amplified with the positive feed-back of the latch. As a result, it becomes possible to perform high-speed sensing.

NMOS transistors MN1 and MN2 become operable only in the final latch operation, and the signal has been sufficiently amplified prior to the latch operation. Therefore, variations of these NMOS transistors MN1 and MN2 will hardly affect the sense margin.

The improved sense amplifier described above is effective in such a case that the cell current Ic is substantially comparable to the variation of the sense amplifier current based on the transistor variations. On the other hand, in case the cell current is so large as several μA, other configurations may be used.

Figure 12:
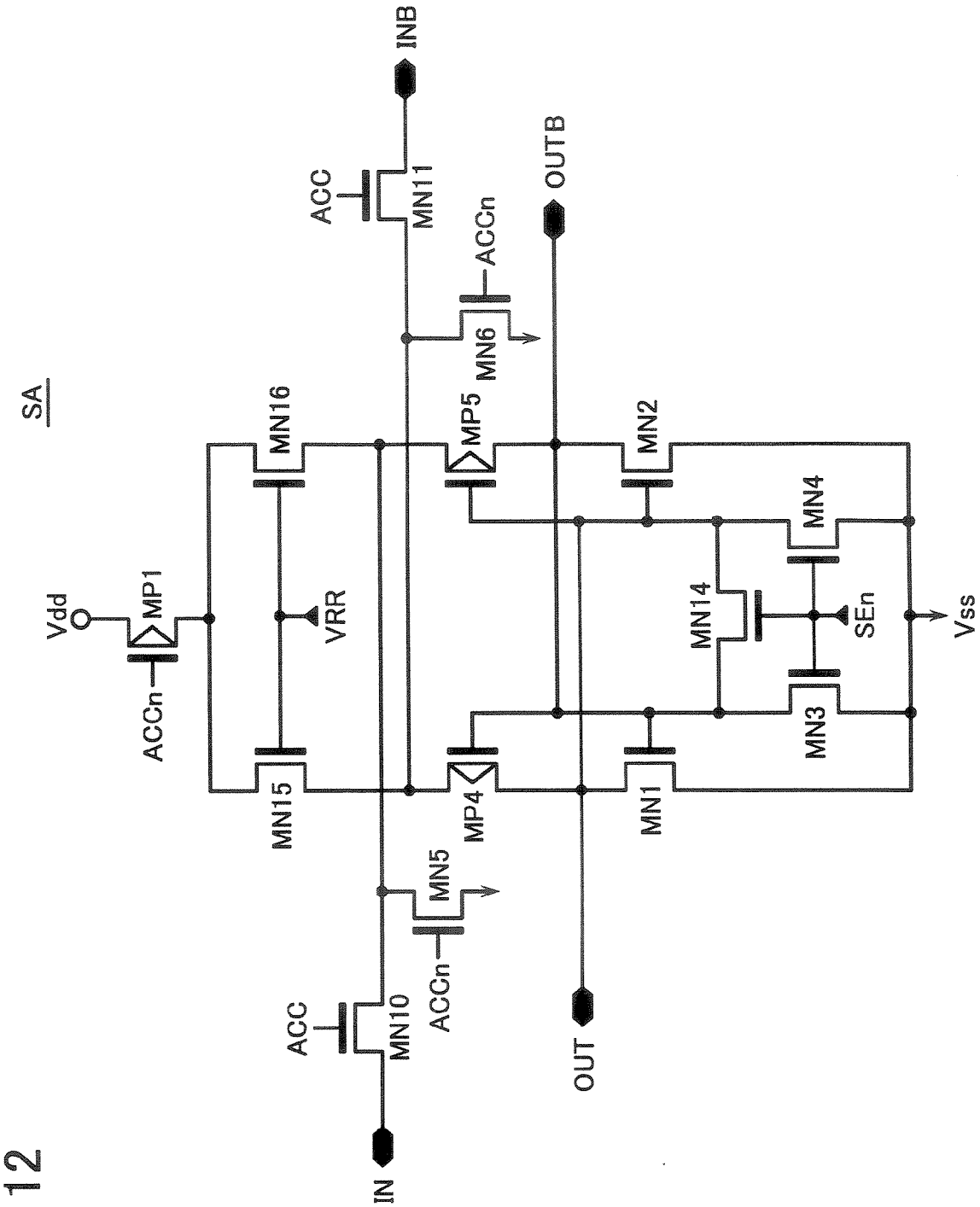
FIG. 12 shows a sense amplifier in accordance with another embodiment.

The sense amplifier shown in FIG. 12 is another example. While the current-limiting NMOS transistors MN15 and MN16 are introduced into the sense amplifier SA shown in FIG. 10, PMOS transistors MP2 and MP3 disposed on the power supply node side of NMOS transistors MN15 and MN16 are removed in this example. Drains of NMOS transistors MN15 and MN16 are coupled to the power supply node Vdd via the PMOS transistor MP1, and sources thereof are coupled to the input nodes INB and IN. The gates of PMOS transistors MP4 and MP5 are coupled to the output nodes OUTB and OUT, respectively, as similar to that shown in FIG. 7.

Since it is possible to form the latch with PMOS transistors MP4, MP5 and NMOS transistors MN1, MN2, PMOS transistors MP2 and MP3 may be removed. As a result, the affection of variations of transistors MP2 and MP3 is removed, and causes of variations will be made less. Further, since the resistance components of PMOS transistors MP2 and MP3 are lost, it becomes possible to carry a more amount of current when the control signal VRR is boosted, thereby becoming possible to do high-speed sense in correspondence with the current increase.

Figure 13:
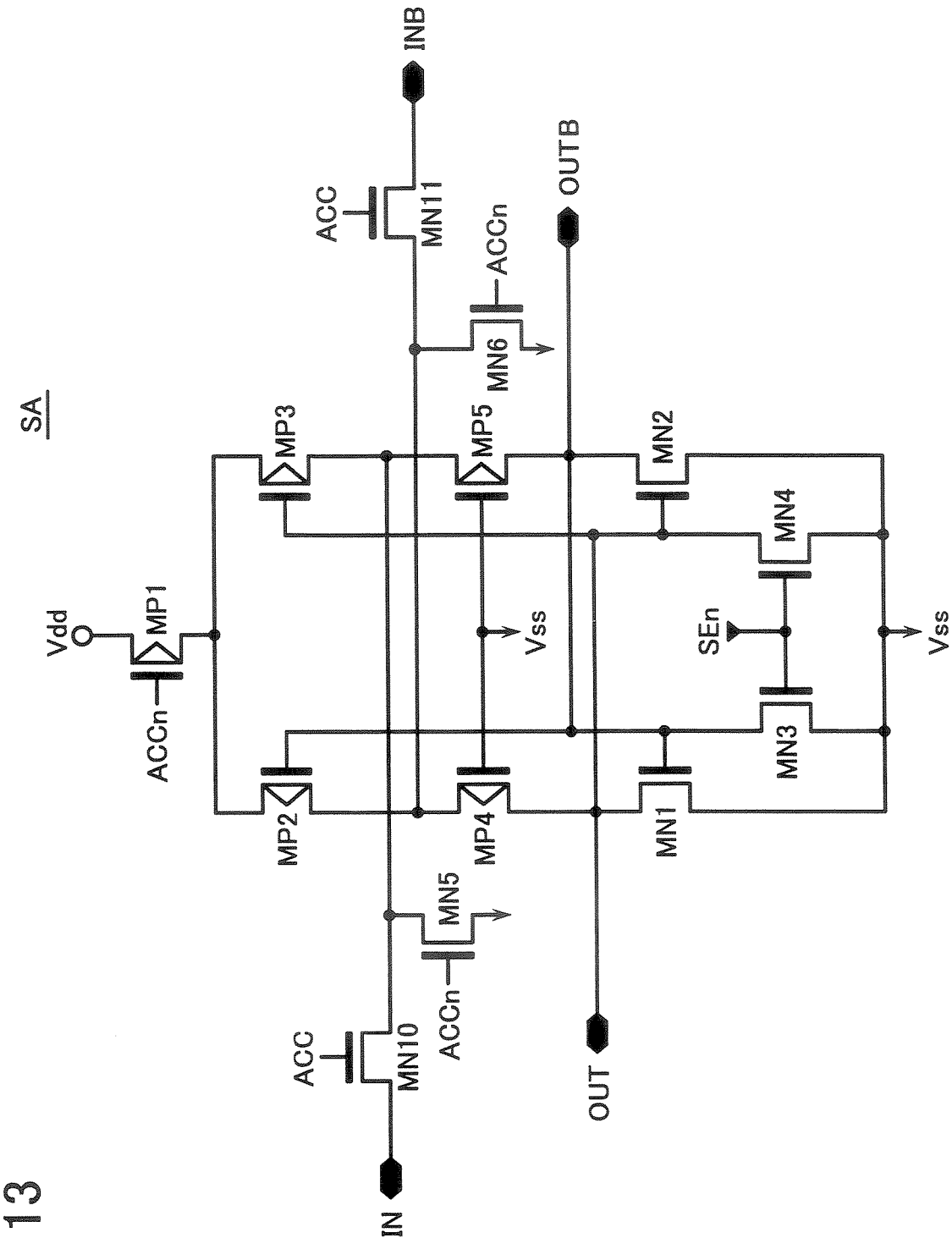
FIG. 13 shows a sense amplifier in accordance with still another embodiment.

FIG. 13 shows a further simplified sense amplifier configuration. This is formed based on the circuit shown in FIG. 9, in which the common gate of PMOS transistors MP4 and MP5 constituting a latch is coupled to Vss, and equalizing NMOS transistor MN14 shown in FIG. 9 is removed. This means that in case cell current Ic is over a certain level, there is no need of equalizing the output nodes OUT and OUTB at the beginning of sensing. As a result, it becomes possible to perform a high-speed sense.

Figure 14:
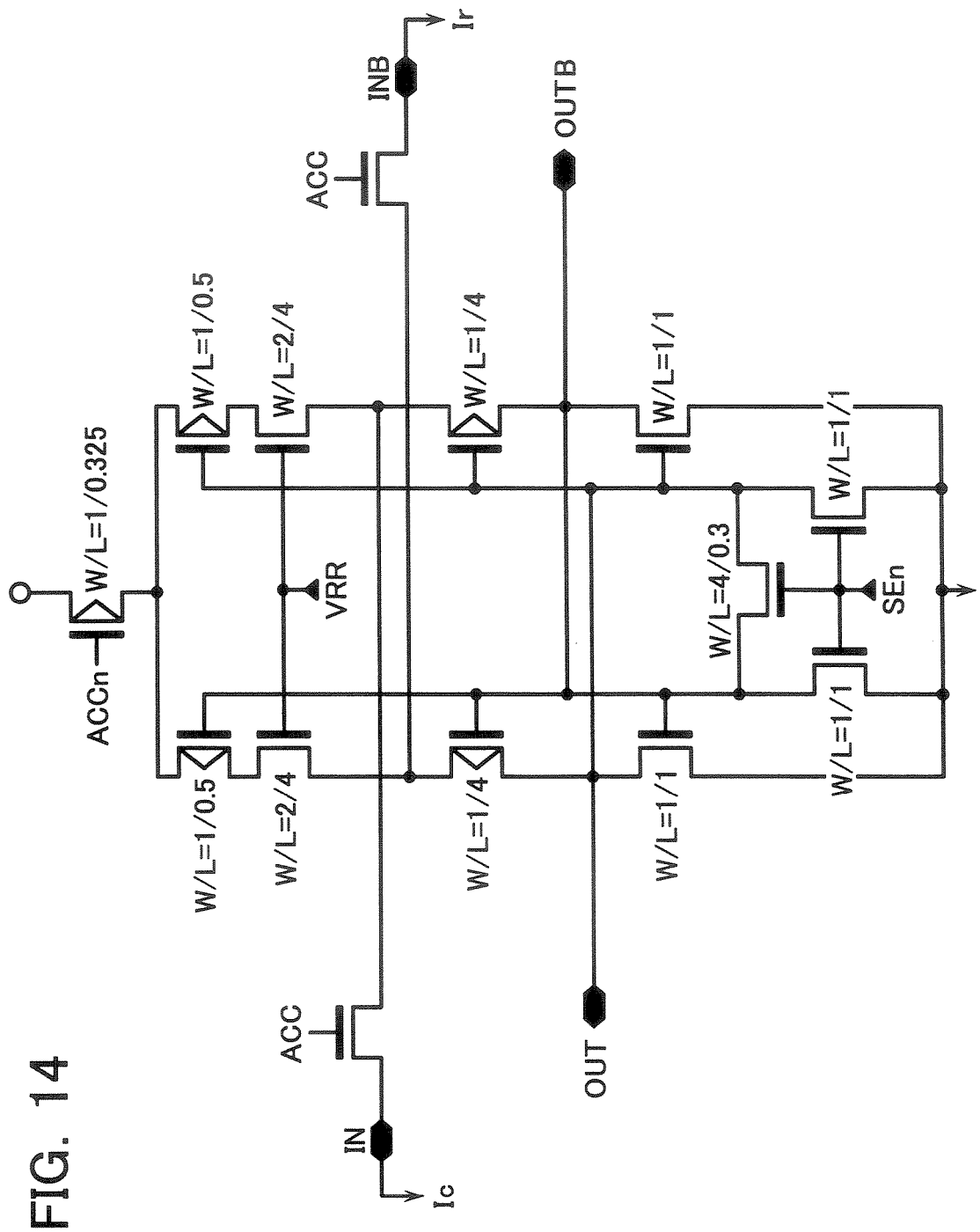
FIG. 14 shows transistor sizes of the sense amplifier shown in FIG. 10, which have been used in simulation.
Figure 15:
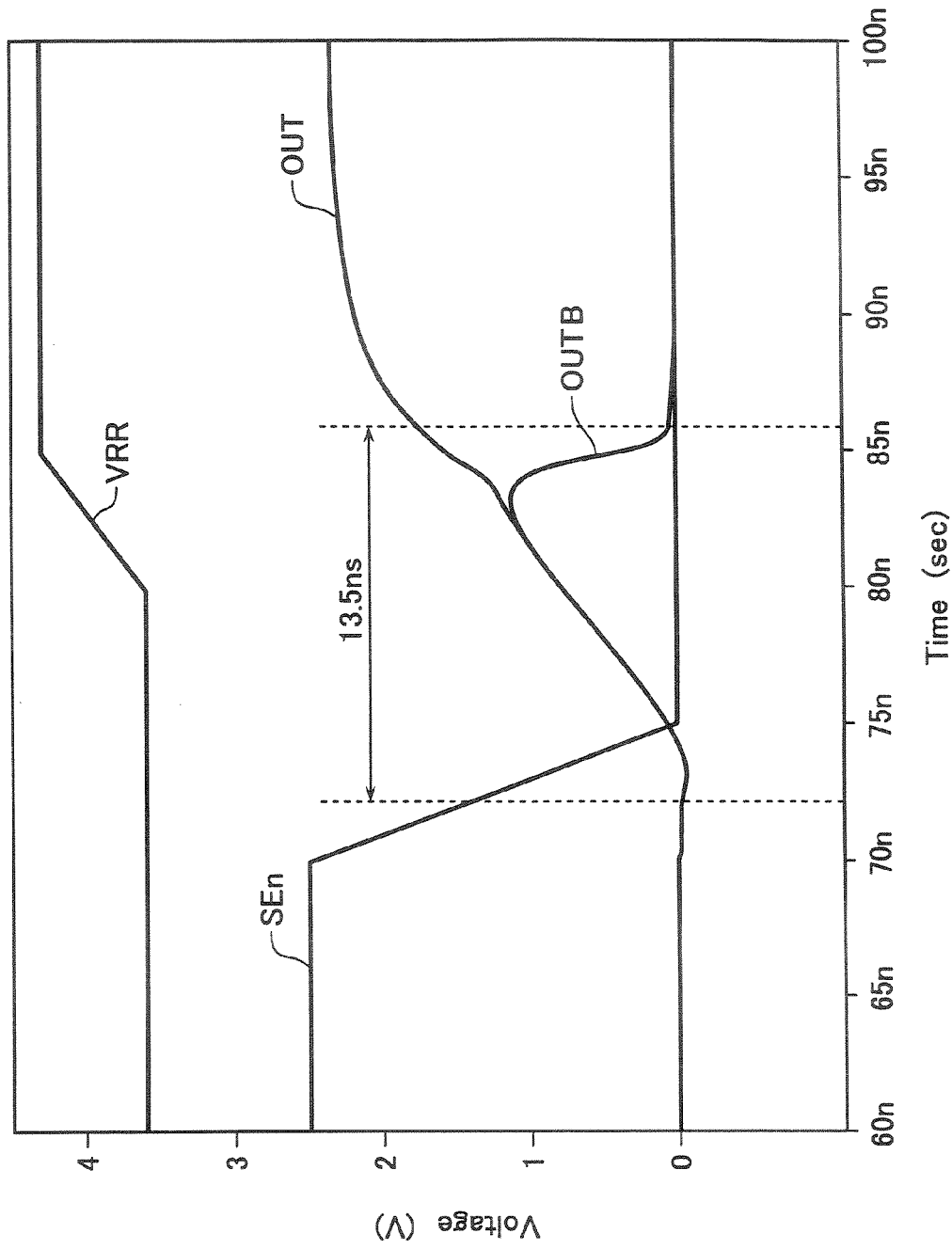
FIG. 15 shows the simulation result of the sense amplifier operation.

Next, simulation data with respect to the sense amplifier SA shown in FIG. 10 will be explained below. FIG. 14 shows transistor sizes (i.e., ratio of channel width W to channel length L, W/L) used in the simulation in the sense amplifier SA shown in FIG. 10. FIG. 15 is a simulation result that shows the voltage transition of the output nodes OUT and OUTB after the sense signal SEn becomes "L".

The simulation is performed on the assumption that bit line resistance is 60 kΩ; bit line capacitance 1 pF; cell current Ic=150 nA; and reference current Ir=50 nA (i.e., current difference is ΔIc=100 nA). Control signal VRR is kept at 3.6V during the sense signal SEn is "H", and then set at 4.2V as delayed by about 15 ns after SEn becoming "L".

As shown in FIG. 15, it takes about 13.5 nsec to decide "H" and "L" of the output nodes OUT, OUTB after the sense signal SEn becomes "L". Therefore, it should be appropriated that it becomes possible to sense the small current difference of 100 nA at a rate of 15 nsec or less with the sense amplifier in accordance with this embodiment.

This invention is not limited to the above-described embodiment. For example, while a NAND-type flash memory has been explained, this invention may be adapted to other flash memories, which detect the cell current in comparison with the reference current to sense data.

What is claimed is:

1. A sense amplifier comprising: first and second input nodes, to one of which a cell current is provided, a reference current being provided to the other;

first and second output nodes, to which cell data are amplified and output, the cell data being defined by the difference between the cell current and the reference current;

first and second NMOS transistors, drains thereof being coupled to the first and second output nodes, respectively, gates thereof being coupled to the second and first output nodes, respectively, sources thereof being coupled in common to a ground potential node;

first and second PMOS transistors, drains thereof being coupled to the drains of the first and second NMOS transistors, respectively, sources thereof being coupled to the second and first input nodes, respectively, the first and second PMOS transistor constituting a latch with the first and second NMOS transistors;

third and fourth PMOS transistors, drains thereof being coupled to the second and first input nodes, respectively, gates thereof being coupled to the second and first output nodes, respectively, sources thereof being coupled in common to a power supply node via a current source switching device;

third and fourth NMOS transistors disposed between the second and first output nodes and the ground potential node, respectively, and turned on before sensing; and an equalizing transistor disposed between the first and second output nodes to equalize the first and second output nodes in potential before sensing, wherein the current source switching device is a fifth PMOS transistor, which is driven by an activation signal, the third and fourth NMOS transistors are off-driven by a sense signal generated after the activation signal, and the equalizing transistor is a fifth NMOS transistor, which is off-driven by the sense signal at the same time as the third and fourth NMOS transistors; and bit line precharging NMOS transistors disposed at the first and second input nodes, which are driven for a certain period prior to the activation signal to precharge bit lines to be coupled to the first and second input nodes; and separating NMOS transistors disposed between the first and second input node and the sense amplifier body portion, which are driven as complementary to the fifth PMOS transistors.

2. The sense amplifier according to claim 1, further comprising:

first and second current limiting NMOS transistors disposed on the source sides of the third and fourth PMOS transistors, respectively, common gate thereof being provided with a control signal, to squeeze the sense amplifier current at the beginning of sensing.

3. The sense amplifier according to claim 2, wherein the control signal is set at such a level that a threshold voltage of the first or second PMOS transistors is added to a threshold voltage of the first or second current limiting NMOS transistors.

4. The sense amplifier according to claim 1, wherein the gates of the first and second PMOS transistors are coupled to those of the first and second NMOS transistors, respectively.

5. The sense amplifier according to claim 1, wherein the gates of the first and second PMOS transistors are coupled in common to the ground potential node.

6. A semiconductor memory device comprising a cell array with electrically rewritable and non-volatile memory cells arranged therein, and a current-detecting type of sense amplifier configured to sense data of a selected memory cell in the cell array, wherein the sense amplifier comprises:

first and second input nodes, to one of which a cell current is provided, a reference current being provided to the other;

first and second output nodes, to which cell data are amplified and output, the cell data being defined by the difference between the cell current and the reference current;

first and second NMOS transistors, drains thereof being coupled to the first and second output nodes, respectively, gates thereof being coupled to the second and first output nodes, respectively, sources thereof being coupled in common to a ground potential node;

first and second PMOS transistors, drains thereof being coupled to the drains of the first and second NMOS transistors, respectively, sources thereof being coupled to the second and first input nodes, respectively, the first and second PMOS transistor constituting a latch with the first and second NMOS transistors;

third and fourth PMOS transistors, drains thereof being coupled to the second and first input nodes, respectively, gates thereof being coupled to the second and first output nodes, respectively, sources thereof being coupled in common to a power supply node via a current source switching device;

third and fourth NMOS transistors disposed between the second and first output nodes and the ground potential node, respectively, and turned on before sensing; and an equalizing transistor disposed between the first and second output nodes to equalize the first and second output nodes in potential before sensing, wherein the current source switching device is a fifth PMOS transistor, which is driven by an activation signal, the third and fourth NMOS transistors are off-driven by a sense signal generated after the activation signal, and the equalizing transistor is a fifth NMOS transistor, which is off-driven by the sense signal at the same time as the third and fourth NMOS transistors; wherein the sense amplifier further comprises: bit line precharging NMOS transistors disposed at the first and second input nodes, which are driven for a certain period prior to the activation signal to precharge bit lines to be coupled to the first and second input nodes; and separating NMOS transistors disposed between the first and second input node and the sense amplifier body portion, which are driven as complementary to the fifth PMOS transistor.

7. The semiconductor memory device according to claim 6, wherein the sense amplifier further comprises:

first and second current limiting NMOS transistors disposed on the source sides of the third and fourth PMOS transistors, respectively, common gate thereof being provided with a control signal, to squeeze the sense amplifier current at the beginning of sensing.

8. The semiconductor memory device according to claim 7, wherein the control signal is set at such a level that a threshold voltage of the first or second PMOS transistors is added to a threshold voltage of the first or second current limiting NMOS transistors.

9. The semiconductor memory device according to claim 6, wherein the gates of the first and second PMOS transistors are coupled to those of the first and second NMOS transistors, respectively.

10. The semiconductor memory device according to claim 6, wherein the gates of the first and second PMOS transistors are coupled in common to the ground potential node.

11. The semiconductor memory device according to claim 6, wherein the cell array includes a plurality of information cell blocks, in each of which the cell current flows in accordance with cell data, and at least one reference cell block, in which the reference current flows.

12. A sense amplifier comprising:

first and second input nodes, to one of which a cell current is provided, a reference current being provided to the other;

first and second output nodes, to which cell data are amplified and output, the cell data being defined by the difference between the cell current and the reference current;

first and second NMOS transistors, drains thereof being coupled to the first and second output nodes, respectively, gates thereof being coupled to the second and first output nodes, respectively, sources thereof being coupled in common to a ground potential node;

first and second PMOS transistors, drains thereof being coupled to the drains of the first and second NMOS transistors, respectively, sources thereof being coupled to the second and first input nodes, respectively, the first and second PMOS transistor constituting a latch with the first and second NMOS transistors;

first and second current limiting NMOS transistors for squeezing the sense amplifier current at the beginning of sensing, sources thereof being coupled to the second and first input nodes, respectively, common gate thereof being provided with a control signal, drains thereof being coupled in common to a power supply node via a current source switching device;

third and fourth NMOS transistors disposed between the second and first output nodes and the ground potential node, respectively, and tuned on before sensing; and an equalizing transistor disposed between the first and second output nodes to equalize the first and second output nodes in potential before sensing, wherein the current source switching device is a third PMOS transistor, which is driven by an activation signal, and the third and fourth NMOS transistors are off-driven by a sense signal generated after the activation signal, and the equalizing transistor is a fifth NMOS transistor, which is off-driven by the sense signal at the same time as the third and fourth NMOS transistors; and bit line precharging NMOS transistors disposed at the first and second input nodes, which are driven for a certain period prior to the activation signal to precharge bit lines to be coupled to the first and second input nodes; and separating NMOS transistors disposed between the first and second input node and the sense amplifier body portion, which are driven as complementary to the third PMOS transistors.

13. The sense amplifier according to claim 12, wherein the control signal is set at such a level that a threshold voltage of the first or second PMOS transistors is added to a threshold voltage of the first or second current limiting NMOS transistors.

* * * * *